(12) United States Patent
Kaspar et al.

(10) Patent No.: US 8,415,802 B2
(45) Date of Patent: Apr. 9, 2013

(54) STRIP CONDUCTOR STRUCTURE FOR MINIMIZING THERMOMECHANICAL LOADS

(75) Inventors: Michael Kaspar, Putzbrunn (DE); Karl Weidner, München (DE); Robert Weinke, München (DE); Hans Wulkesch, München (DE)

(73) Assignee: Siemens Aktiengesellschaft, Munich (DE)

( * ) Notice: Subject to any disclaimer, the term of this patent is extended or adjusted under 35 U.S.C. 154(b) by 220 days.

(21) Appl. No.: 12/805,361

(22) Filed: Jul. 27, 2010

(65) Prior Publication Data
US 2010/0289152 A1 Nov. 18, 2010

Related U.S. Application Data

(62) Division of application No. 11/795,757, filed as application No. PCT/EP2005/056447 on Dec. 2, 2005, now abandoned.

(30) Foreign Application Priority Data

Jan. 21, 2005 (DE) .......................... 10 2005 002 987

(51) Int. Cl.
*H01L 29/41* (2006.01)
(52) U.S. Cl. .................. 257/773; 257/E21.506; 438/666
(58) Field of Classification Search .................. 257/739, 257/773, E21.506; 438/666
See application file for complete search history.

(56) References Cited

U.S. PATENT DOCUMENTS

| 5,086,337 | A | 2/1992 | Noro et al. |
| 5,162,260 | A | 11/1992 | Leibovitz et al. |
| 5,900,674 | A | 5/1999 | Wojnarowski et al. |
| 6,888,362 | B2 | 5/2005 | Eldridge et al. |
| 7,402,457 | B2 | 7/2008 | Hase et al. |
| 2002/0055282 | A1 | 5/2002 | Eldridge et al. |
| 2003/0057515 | A1 | 3/2003 | Fillion et al. |
| 2004/0101663 | A1 | 5/2004 | Agarwala et al. |
| 2005/0032347 | A1 | 2/2005 | Hase et al. |

FOREIGN PATENT DOCUMENTS

| WO | WO 02/101830 | 12/2002 |
| WO | WO 03/030247 | 4/2003 |

OTHER PUBLICATIONS

English translation of the description of WO 03/030247.
English translation of the claims of WO 03/030247.

*Primary Examiner* — Tom Thomas
*Assistant Examiner* — Christopher M Roland
(74) *Attorney, Agent, or Firm* — Harness, Dickey & Pierce, P.L.C.

(57) ABSTRACT

A semiconductor chip device including a surface on which at least one electrical contact surface is provided. A foil from an electrically insulating material is applied, especially by vacuum, to the surface and rests closely to the surface and adheres to the surface. The foil, in the area of the contact surface, is provided with a window in which the contact surface is devoid of the foil and is contacted across a large area to at least one layer from an electroconductive material. In at least one embodiment, the layer from the electroconductive material is part of a flexible contact for electrically connecting the contact surface to at least one external connecting conductor.

18 Claims, 2 Drawing Sheets

STRIP CONDUCTOR STRUCTURE FOR MINIMIZING THERMOMECHANICAL LOADS

PRIORITY STATEMENT

This application is a divisional of U.S. patent application Ser. No. 11/795,757 filed on Jul. 20, 2007, now abandoned which is the national phase under 35 U.S.C. §371 of PCT International Application No. PCT/EP2005/056447 which has an International filing date of Dec. 2, 2005, which designated the United States of America and which claims priority on German Patent Application number 10 2005 002 987.6 filed Jan. 21, 2005, the entire contents of each of which are hereby incorporated herein by reference.

FIELD

At least one embodiment of the present invention relates to a device. For example, it may relate to a semiconductor chip device having a surface on which at least one electrical contact surface is provided, whereby a foil made from electrically insulating material is provided on the surface, particularly by vacuum, which lies tightly against the surface and adheres to the surface, whereby the foil has a window at the contact surface in which this contact surface is free of the foil and planar contact is established with at least one layer made from electrically conducting material.

BACKGROUND

As a consequence of the different thermal expansion behavior of the materials involved, thermomechanical stresses occur at the contact points of the semiconductor devices, namely predominantly in corner areas, which result in contact points metalized over their full area breaking.

Conventionally, interrupted contacts or contact points broken on semiconductor devices should be prevented by adapting the thermal coefficients of expansion of the materials in question. This solution is complex. Materials with adapted coefficients of expansion are not available.

Patent specification US 2004/101663 A1 discloses a stacked through-pin with improved reliability in copper metallurgy. An integrated multi-layer semiconductor circuit structure has a first connection layer which has a layer made from dielectric material over a semiconductor substrate, whereby the layer made from dielectric material has a dense material for the passivation of semiconductor devices and local connections beneath. In addition, a silicon substrate is disclosed, on which a connection layer is provided which is embedded in a passivation layer. A high-power connection is produced by means of highly conducting wiring on different levels which are insulated from one another with layers of low k dielectric constant and connected at desired points by metal-filled through-pins.

Patent specification WO 03/030247 A2 discloses a method for contacting electrical contact surfaces on a surface of a substrate, whereby a foil is laminated under vacuum onto the surface on a polyimide or epoxide base in such a way that the foil tightly covers the surface with the contact surfaces and adheres on this surface. Each contact surface to be contacted on the surface is exposed by opening respective windows in the foil. Planar contact is established with each exposed contact surface by means of a layer of metal.

Patent specification WO 02/101830 A2 discloses electronic components having a plurality of microelectronic spring contacts.

U.S. Pat. No. 5,086,337 discloses a connection structure and also an electronic device using this structure. A contacting structure for establishing electrical contact with an electronic component, such as a chip on a substrate for example, the manufacturing method and an electronic device using the structure are described.

Patent specification US 2003/0057 515 A1 discloses a manufacturing method for electronic interface structures. Such a structure has a substrate whereby one area with elastomers is carried through the substrate. A structured metallization covers the elastomer area. The metallization has at least one fluid small area which at least partially covers the elastomer area.

SUMMARY

At least one embodiment of the present invention creates contact points on semiconductor devices which are insensitive to thermomechanical stresses such that any interruption of electrical connections is effectively avoided in a simple manner.

Strip conductors are created with structures which are embodied such that thermomechanical stresses are diverted and distributed in order to prevent a breakage of strip conductors and a breakage in the continuation of the strip conductors. A flexible contacting facility is provided for electrically connecting a contact surface to at least one outer conductor. Flexible means mechanically elastic. The flexibility is accomplished by way of the geometry of the flexible contacting facility.

The flexibility of the contacting facility is thereby advantageously improved particularly when a layer made from electrically conducting material simply partially covers the contact surface as part of the contacting facility. It is especially advantageous if the area of the layer made from electrically conducting material is smaller than the contact surface. This improves the provision of a flexible contacting facility by way of an advantageous shaping which increases the flexibility of the contacting facility. In this manner it is possible to reduce the thermomechanical load by using strip conductors originating from the layer made from electrically conducting material, running toward the outside, serving for electrical control purposes or for reading from the semiconductor devices. These strip conductors can extend into an outer connecting conductor. A plurality of layers made from electrically conducting material can be provided in parallel on the contact surface. These layers can be positioned as desired on the contact surface.

At least one strip conductor originating from the at least one layer made from electrically conducting material running radially toward the outside extends into at least one outer connecting conductor for controlling and reading from the at least one semiconductor chip. Radially also includes a spiral-shaped extension. Radially means along a radius, extending from inside to outside.

At least one strip conductor originating from the at least one layer made from electrically conducting material running radially toward the outside extends by way of a ring-shaped outer strip conductor into at least one outer connecting conductor for controlling and reading from the at least one semiconductor chip. In other words, strip conductors running toward the outside end in an outer strip conductor ring which encloses the layer made from electrically conducting material. At least one outer connecting conductor is connected electrically to the outer strip conductor ring. Ring-shaped is a general term for round and/or circular. A ring can, but does not necessarily have to, run along a circular curve. A ring can also be open, in other words it can have two ends along a circular path. A ring-shaped outer strip conductor can be delimited by an inner and an outer circular curve.

According to a further advantageous embodiment, at least one ring-shaped strip conductor and/or at least three strip conductors running radially toward the outside are implemented. This geometry can thus for example be compared with the steering wheel of a motor vehicle.

According to a further advantageous embodiment, the strip conductor(s) running radially have at least one angular bulge. These serrations can advantageously be provided on the insulating layer or foil and absorb thermomechanical stresses.

According to a further advantageous embodiment, at least two angular bulges are oriented in the same circumferential direction. In this manner, thermomechanical stresses can be simply dissipated directionally.

According to a further advantageous embodiment, a strip conductor originating from the area of the layer made from electrically conducting material and running radially in a spiral toward the outside extends into a, particularly ring-shaped, outer strip conductor. By providing a spiral, it is likewise possible to effectively produce a flexible contacting facility.

According to an advantageous embodiment, the layer made from electrically conducting material is implemented as a round central area for the contacting facility in the center of the contact surface. The central area lies approximately at the geometric center of the contacting facility. A contacting facility is a planar strip conductor structure which produces a geometric formation. This can be round, circular, ring-shaped, spiral-shaped and also square, rectangular and/or square-edged.

Correspondingly, it is possible to define a central area of the geometric formation for the contacting facility. The central area can likewise be round, circular, ring-shaped, spiral-shaped and basically also square, rectangular and/or square-edged. Other forms are likewise possible. The central area is produced in the geometric center of the contact surface, whereby the layer made from electrically conducting material can have a form corresponding to the form of the contact surface. According to this further embodiment, at least one strip conductor originating from the central area running radially toward the outside can extend into a ring-shaped outer strip conductor.

According to a further advantageous embodiment, the central area is circular and has a diameter which is smaller than a diameter of the contact surface.

According to a further advantageous embodiment, at least one outer conductor extends radially out of the outer strip conductor of the contacting facility. In this situation, this outer conductor is regarded as part of the contacting facility. By way of this outer conductor a connection is established with at least one outer connecting conductor which is not part of the contacting facility.

According to a further advantageous embodiment, the foil narrows or the thickness of the foil is reduced in the direction of the window. This can occur stepwise. Thermomechanical loads can likewise be minimized in this manner since the difference of changes in size of the contacting facility with the foil is therefore likewise minimized.

According to a further advantageous embodiment, the foil in the area of the window is crater-shaped and/or V-shaped, whereby a gradient lies in the range greater than 20° and less than 60°.

According to a further advantageous embodiment, the contacting facility is connected mechanically with the foil and the contact surface. The route of the outer strip conductor is thus adapted to the form of the window, with the result that thermomechanical loads are thereby likewise minimized.

According to a further advantageous embodiment, the flexible contacting facility features copper, and/or the thickness of the flexible contacting facility is minimized having regard to the power consumption of the semiconductor chip. If the semiconductor chip is a field effect transistor, the flexible contacting facility for controlling a gate has a thickness for example in the range from approx. 10 μm to approx. 100 μm. For the purposes of the electrical contact between a source and a drain the thickness of the flexible contacting facility lies for example in the range from approx. 50 μm to approx. 500 μm.

According to a further advantageous embodiment, the thickness of the foil is minimized having regard to its insulating properties. In other words, in order to reduce thermomechanical stresses the foil is provided in as thin a form as possible such that is still satisfies the requirements for electrical insulation.

According to a further advantageous embodiment, a substrate with a surface is used which is equipped with one or more semiconductor chips, on each of which one or more contact surfaces to be contacted is or are present in each case, and the foil is applied, particularly under vacuum, to this surface, particularly laminated on, such that the foil very tightly covers this surface including each semiconductor chip and each contact surface and adheres on this surface including each semiconductor chip.

According to a further advantageous embodiment, a substrate with a surface equipped with one or more power semiconductor chips is used.

BRIEF DESCRIPTION OF THE DRAWINGS

The present invention will be described in detail with regard to embodiments. In the drawings.

DETAILED DESCRIPTION OF THE EXAMPLE EMBODIMENTS

Figure 1:
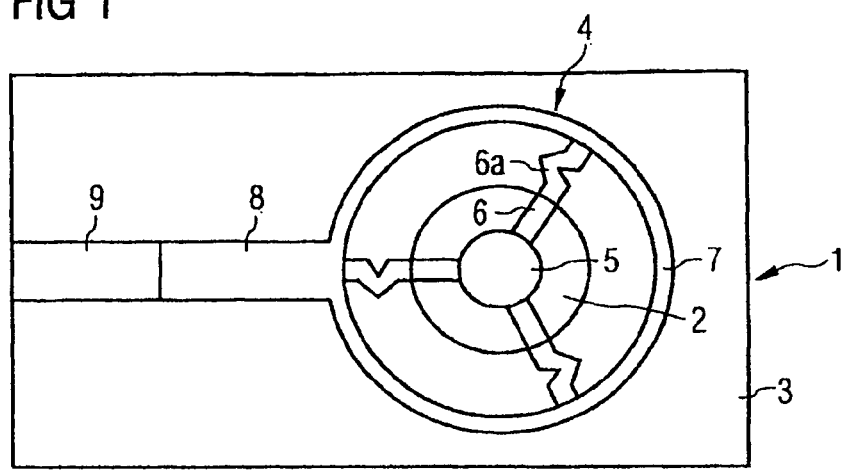
FIG. 1 shows a first embodiment of a strip conductor structure according to the invention.

FIG. 1 shows a first embodiment of a strip conductor structure according to the invention. A flexible contacting facility 4 is illustrated, whereby a layer made from electrically conducting material is part of the flexible contacting facility 4 for establishing the electrical connection between the contact surface 2 of a chip 1 and an outer conductor 8. The layer made from electrically conducting material is implemented as a round and circular central area 5 of the contacting facility 4. The area of the layer made from electrically conducting material is smaller than the contact surface 2. Originating from the central area 5, three strip conductors 6 running radially toward the outside extend into a ring-shaped outer strip conductor 7. The strip conductors 6 running radially each have at least one angular bulge 6a. An angular bulge 6a can also be regarded as a serration 6a. The angular bulges 6a are oriented in the same circumferential direction. The outer strip conductor 7 frames the window.

Figure 2:
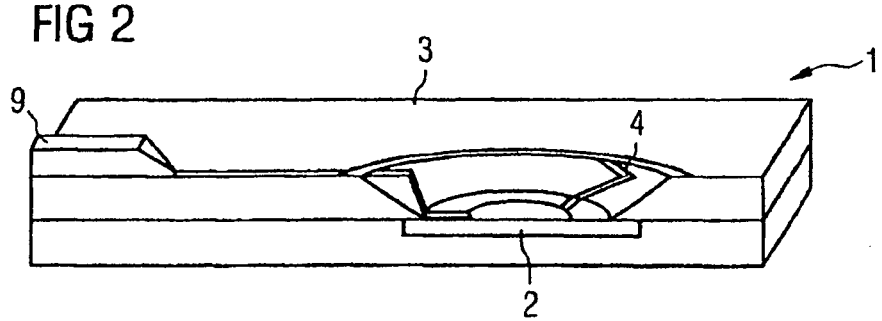
FIG. 2 shows a cross-section of the first embodiment.

FIG. 2 shows a cross-section of the first embodiment of a flexible contacting facility 4. An insulating layer 3 or an insulating foil 3 is provided on the chip 1. A contact point 2, which is connected electrically by way of the contacting facility 4 to a connecting conductor 9, is provided in a crater-shaped window in the insulating layer 3 on a chip 1. The contacting facility 4 here has a form which is comparable with that of a steering wheel in a motor vehicle.

Figure 3:
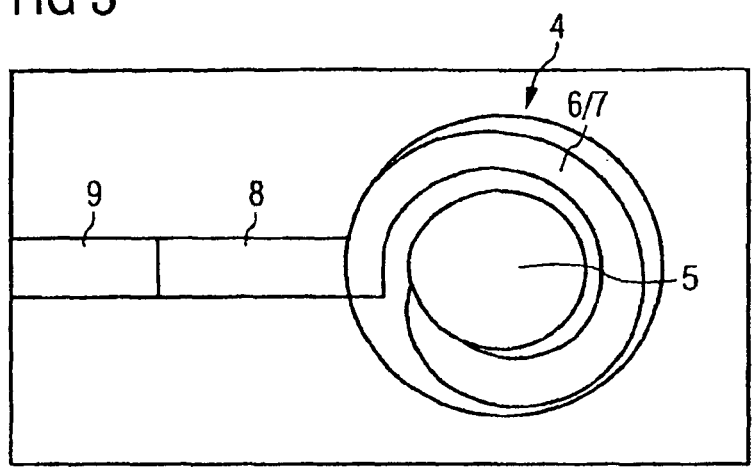
FIG. 3 shows a second embodiment of a strip conductor structure according to the invention.

FIG. 3 shows a second embodiment of a contacting facility 4. Originating from a central area 5, a strip conductor 6 running radially in a spiral toward the outside extends into a ring-shaped outer strip conductor 7. The contacting facility 4 can be regarded in its entirety as a strip conductor spiral. Outside of the central area 5, the spiral-shaped strip conductor has a width which approximately corresponds to the width of the outer conductor 8. Reference character 9 denotes an outer connecting conductor 9 for controlling and reading from the at least one semiconductor chip 1.

Figure 4:
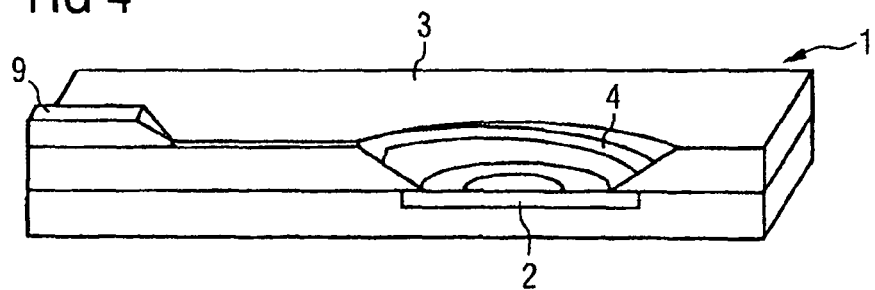
FIG. 4 shows a cross-section of the second embodiment.

FIG. 4 shows a cross-section of the second embodiment. An insulating layer 3 or an insulating foil 3 is provided on the chip 1. A contact point 2, which is connected electrically by way of the contacting facility 4 to a connecting conductor 9, is provided in a crater-shaped window in the insulating layer 3 on a chip 1. The contacting facility 4 here has the form of a spiral.

In FIGS. 1 and 3, an outer conductor 8 extends out of the outer ring-shaped strip conductor 7 of the contacting facility 4, and this occurs radially with respect to the central area 5. This outer conductor 8 is a connection to an outer connecting conductor 9, by means of which the chip 1 is controlled and/or read out. The central area 5 is essentially circular and has a diameter which is smaller than a diameter of the contact surface 2. The insulating layer 3 or foil 3 is crater-shaped in the area of the window. In this manner, the strip conductor track to the outside can be simplified. The contacting facility 4 is connected mechanically to the foil 3 and the contact surface 2. According to a further advantageous embodiment, the ring-shaped, the radial and/or the spiral-shaped strip conductors have a width which corresponds to the width of an outer conductor 8.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A semiconductor chip device, comprising:
at least one electrical contact surface in direct contact with a surface of the device;
a foil, made from electrically insulating material, provided on the surface of the device, the foil including a window at the contact surface in which the contact surface is free of the foil and planar contact is established with at least one layer made from electrically conducting material, whereby the at least one layer is on a surface of the electrical contact surface and is part of a flexible contacting facility, which is mechanically flexible because of its geometry, for establishing an electrical connection between the contact surface and at least one outer connecting conductor, and whereby, originating from the at least one layer made from electrically conducting material, at least one strip conductor running radially up a side wall of the foil toward an outside of the device extends by way of an outer strip conductor into the outer connecting conductor, the outer strip conductor framing the window and the outer connecting conductor being provided on the foil, wherein an area of the layer made from the electrically conducting material is smaller than the contact surface on which the layer is disposed.

2. The device as claimed in claim 1, further comprising at least three strip conductors, wherein at least one of the at least three strip conductors runs radially and the outer strip conductor has a ring-shape.

3. The device as claimed in claim 2, wherein the at least three strip conductors running radially have at least one angular bulge.

4. The device as claimed in claim 3, wherein at least two angular bulges are oriented in a same circumferential direction.

5. The device as claimed in claim 2, wherein the at least one outer connecting conductor extends radially out of the ring-shaped outer strip conductor of the contacting facility.

6. The device as claimed in claim 1, wherein, originating from the layer made from electrically conducting material, the at least one strip conductor runs radially in a spiral toward the outside and extends into the outer strip conductor, wherein the outer strip conductor has a ring-shape.

7. The device as claimed in claim 1, wherein the layer made from electrically conducting material is implemented as a central area adhered in a center of the contact surface.

8. The device as claimed in claim 7, wherein the central area is circular and has a diameter which is smaller than a diameter of the contact surface.

9. The device as claimed in claim 1, wherein the foil narrows stepwise in a direction of the contact surface.

10. The device as claimed in claim 1, wherein the foil in an area of the window is V-shaped in cross-section and has a gradient in a range greater than 20° and less than 60°.

11. The device as claimed in claim 1, wherein the contacting facility is connected mechanically with the foil and the contact surface.

12. The device as claimed in claim 1, wherein at least one of the flexible contacting facility includes copper, and a thickness of the flexible contacting facility is minimized having regard to a power consumption of the semiconductor chip.

13. The device as claimed in claim 1, wherein a thickness of the foil is minimized having regard to its insulating properties.

14. A device made from a substrate including a surface on which at least one electrical contact surface is in direct contact, whereby a foil made from electrically insulating material is provided on the surface, whereby the foil has a window at the contact surface in which the contact surface forms a bottom of the window and is free of the foil and planar contact is established with at least one layer made from electrically conducting material, whereby the at least one layer is disposed on a surface of the contact surface and is part of a facility which is mechanically flexible because of its geometry, for establishing an electrical connection between the contact surface and at least one outer connecting conductor, and whereby originating from the at least one layer made from electrically conducting material, at least one strip conductor adhered to a side wall of the foil and running radially toward an outside of the device extends by way of an outer strip conductor into the outer connecting conductor, the outer strip conductor framing the window and the outer connecting conductor being provided on the foil.

15. The device as claimed in claim 14, including at least one contact surface, which is at least one of an alternative and an addition to the contact surface on the substrate, on at least one semiconductor chip.

16. The device as claimed in claim 14, wherein an area of the layer made from electrically conducting material is smaller than the contact surface.

17. The device as claimed in claim 14, further comprising at least three strip conductors, wherein at least one of the at least three strip conductors runs radially and the outer strip conductor has a ring-shape.

18. The device as claimed in claim 17, wherein the at least three strip conductors running radially have at least one angular bulge.

* * * * *